United States Patent
Wang et al.

(10) Patent No.: US 10,868,506 B2
(45) Date of Patent: *Dec. 15, 2020

(54) LINE DRIVERS FOR WIRELINE TRANSMISSION DEVICES

(71) Applicant: Taiwan Semiconductor Manufacturing Co., Ltd., Hsinchu (TW)

(72) Inventors: Xin Jie Wang, Kanata (CA); Dirk Pfaff, Ottawa (CA)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/673,506

(22) Filed: Nov. 4, 2019

(65) Prior Publication Data
US 2020/0067470 A1  Feb. 27, 2020

Related U.S. Application Data

(63) Continuation of application No. 15/965,105, filed on Apr. 27, 2018, now Pat. No. 10,498,301.

(51) Int. Cl.
*H03F 1/12* (2006.01)
*H03F 3/72* (2006.01)
(Continued)

(52) U.S. Cl.
CPC ............. *H03F 3/72* (2013.01); *H04B 3/04* (2013.01); *H04L 25/0278* (2013.01);
(Continued)

(58) Field of Classification Search
CPC ........................................................ H03F 1/12
(Continued)

(56) References Cited

U.S. PATENT DOCUMENTS

| 5,546,022 A | 8/1996 | D'Souza et al. |
| 7,279,974 B2 * | 10/2007 | Rowley ............... H03F 3/45183 330/253 |

(Continued)

FOREIGN PATENT DOCUMENTS

| EP | 0655830 A1 | 5/1995 |
| KR | 960027337 A | 7/1996 |

OTHER PUBLICATIONS

Raghavan, B., et al., "A Sub-2 W 39.8-44.6 Gb/s Transmitter and Receiver Chipset With SFI-5.2 Interface in 40 nm CMOS," IEEE 2013.

(Continued)

*Primary Examiner* — Henry Choe
(74) *Attorney, Agent, or Firm* — Sterne, Kessler, Goldstein & Fox P.L.L.C.

(57) ABSTRACT

The present disclosure describes exemplary line drivers for use in an exemplary wireline transmission device. In some situations, the exemplary line drivers are electrically connected to a wireline communication channel to transmit information. The exemplary line drivers prevent charge sharing with the wireline communication channel. The exemplary line drivers disclosed herein charge various circuit nodes to various logical values, such as a logical zero or a logical one, to prevent charge sharing with the wireline communication channel.

20 Claims, 6 Drawing Sheets

(51) Int. Cl.
  *H04L 25/02* (2006.01)
  *H04B 3/04* (2006.01)
  *H04B 3/56* (2006.01)
  *H03F 3/45* (2006.01)
(52) U.S. Cl.
  CPC ...... *H04L 25/0298* (2013.01); *H03F 3/45179* (2013.01); *H03F 2203/45638* (2013.01); *H03F 2203/7239* (2013.01); *H04B 3/56* (2013.01); *H04L 25/0272* (2013.01); *H04L 25/0282* (2013.01)
(58) Field of Classification Search
  USPC .................................................. 330/51, 253
  See application file for complete search history.

(56) References Cited

U.S. PATENT DOCUMENTS

| | | | | |
|---|---|---|---|---|
| 8,030,999 | B2* | 10/2011 | Chatterjee | H03F 3/45071 330/253 |
| 9,832,048 | B2 | 11/2017 | Kireev | |
| 2008/0024172 | A1 | 1/2008 | Yu et al. | |
| 2009/0015329 | A1* | 1/2009 | Chatterjee | H03F 3/45071 330/253 |
| 2011/0204967 | A1 | 8/2011 | Wong et al. | |
| 2012/0293259 | A1* | 11/2012 | Riekki | H03F 1/0277 330/253 |
| 2013/0148452 | A1* | 6/2013 | Schreiber | G11C 7/065 365/203 |

OTHER PUBLICATIONS

Poulton et al. A 0.54 pJ/b 20 Gb/s Ground-Referenced Single-Ended Short-Reach Serial Link in 28 nm CMOS for Advanced Packaging Applications, IEEE Journal of Solid-State Circuits, 2013, pp. 3206-3218, vol. 48, No. 12.

* cited by examiner

LINE DRIVERS FOR WIRELINE TRANSMISSION DEVICES

CROSS-REFERENCE TO RELATED APPLICATIONS

The present application is a continuation of U.S. patent application Ser. No. 15/965,105, filed Apr. 27, 2018, which is incorporated herein by reference in its entirety.

BACKGROUND

Although most recent developments in communications have been primarily focused on wireless communication, there still is a need for wireline communication. Wireline communication uses a wire-based communication technology, such as a version of an Institute of Electrical and Electronics Engineers (IEEE) 802.3 communication standard or protocol, also referred as Ethernet, to provide an example to transmit information. Wireline communication is commonly used in telephone networks, cable television, and fiberoptic communication. The wire-based communication technology often provides more stability when compared to wireless communication technologies of wireless communication. For example, wireline communication is often resistant to hostile weather conditions, With some forms of wire-based communication technologies, the strength and speed of the transmission is superior to wireless communication technologies, such as satellite or microwave transmissions to provide some examples. These characteristics have allowed wireline communication to remain popular, even as wireless communication technologies have continued to advance, especially within automobiles or other modes of transportation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
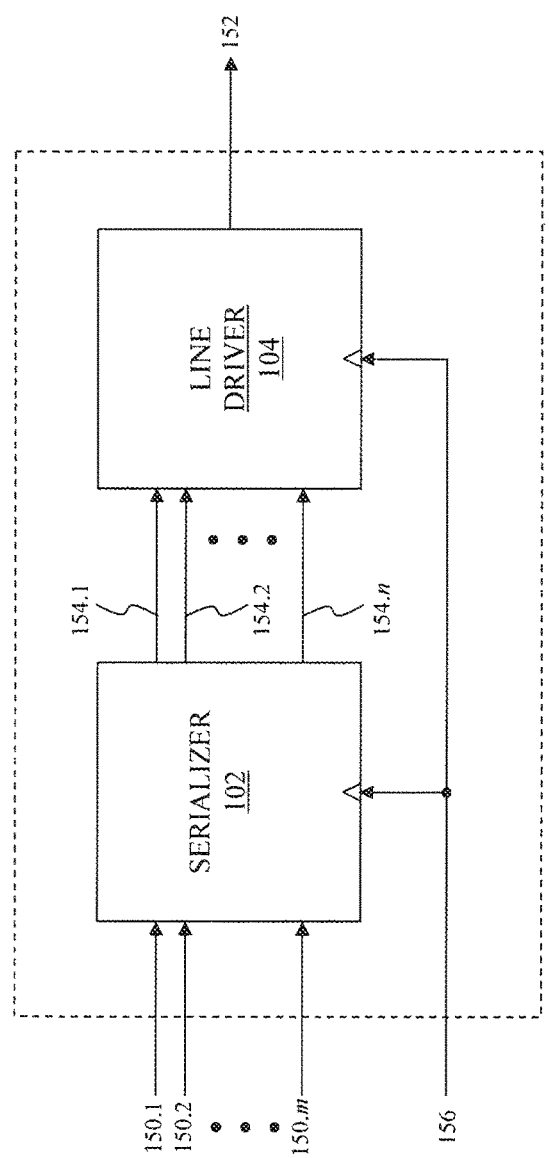
FIG. 1 illustrates a block diagram of an exemplary wireline transmission device according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations described.

Overview

The present disclosure in various embodiments describes exemplary line drivers for use in an exemplary wireline transmission device. In some situations, the exemplary line drivers are electrically connected to a wireline communication channel to transmit information. The exemplary line drivers prevent charge sharing with the wireline communication channel. The exemplary line drivers disclosed herein charge various circuit nodes to various logical values, such as a logical zero or a logical one, to prevent charge sharing with the wireline communication channel.

Exemplary Wireline Transmission Device

FIG. 1 illustrates a block diagram of an exemplary wireline transmission device according to an exemplary embodiment of the present disclosure. A wireline transmission device 100 converts one or more input datastreams 150.1 through 150.*m*, which are received in a parallel format, to provide an output datastream 152 in a serial format. In an exemplary embodiment, the wireline transmission device 100 can be implemented within a wireline communication system, such as a version of an Institute of Electrical and Electronics Engineers (IEEE) 802.3 communication standard or protocol, also referred as Ethernet, such as 50G Ethernet, 100G Ethernet, 200G Ethernet, and/or 400G Ethernet to provide some examples. As illustrated in FIG. 1, the wireline transmission device 100 includes a serializer 102 and a line driver 104.

The serializer 102 converts the one or more input datastreams 150.1 through 150.*m* from the parallel format to provide one or more serial datastreams 154.1 through 154.*n* in the serial format. In an exemplary embodiment, the serializer 102 converts sixty-four (64) input datastreams 150.1 through 150.64 from the parallel format to provide two (2) serial datastreams 154.1 and 154.2 in the serial format. As illustrated in FIG. 1, the serializer 102 converts the one or more input datastreams 150.1 through 150.*m* from the parallel format in accordance with a clocking signal 156 to provide the one or more serial datastreams 154.1 through 154.*n* in the serial format. In an exemplary embodiment, the clocking signal 156 represents a differential clocking signal 156(+), 156(−). In this exemplary embodiment, the clocking signal 156(+) represents a complement of the clocking signal 156(−).

As illustrated in FIG. 1, the line driver 104 can selectively choose from among the one or more serial datastreams 154.1 through 154.*n* to provide the output datastream 152 in the serial format in accordance with the clocking signal 156. For example, the line driver 104 can multiplex the two (2) serial datastreams 154.1 through 154.2 referred to in the exemplary embodiment above to provide the output datastream 154. In the exemplary embodiment illustrated in FIG. 1, the line driver 104 provides the output datastream 152 for transmission over a wireline communication channel, such as one or more twisted pair cables, one or more coaxial cables, and/or one or more fiber optic cables to provide some examples.

Figure 2:
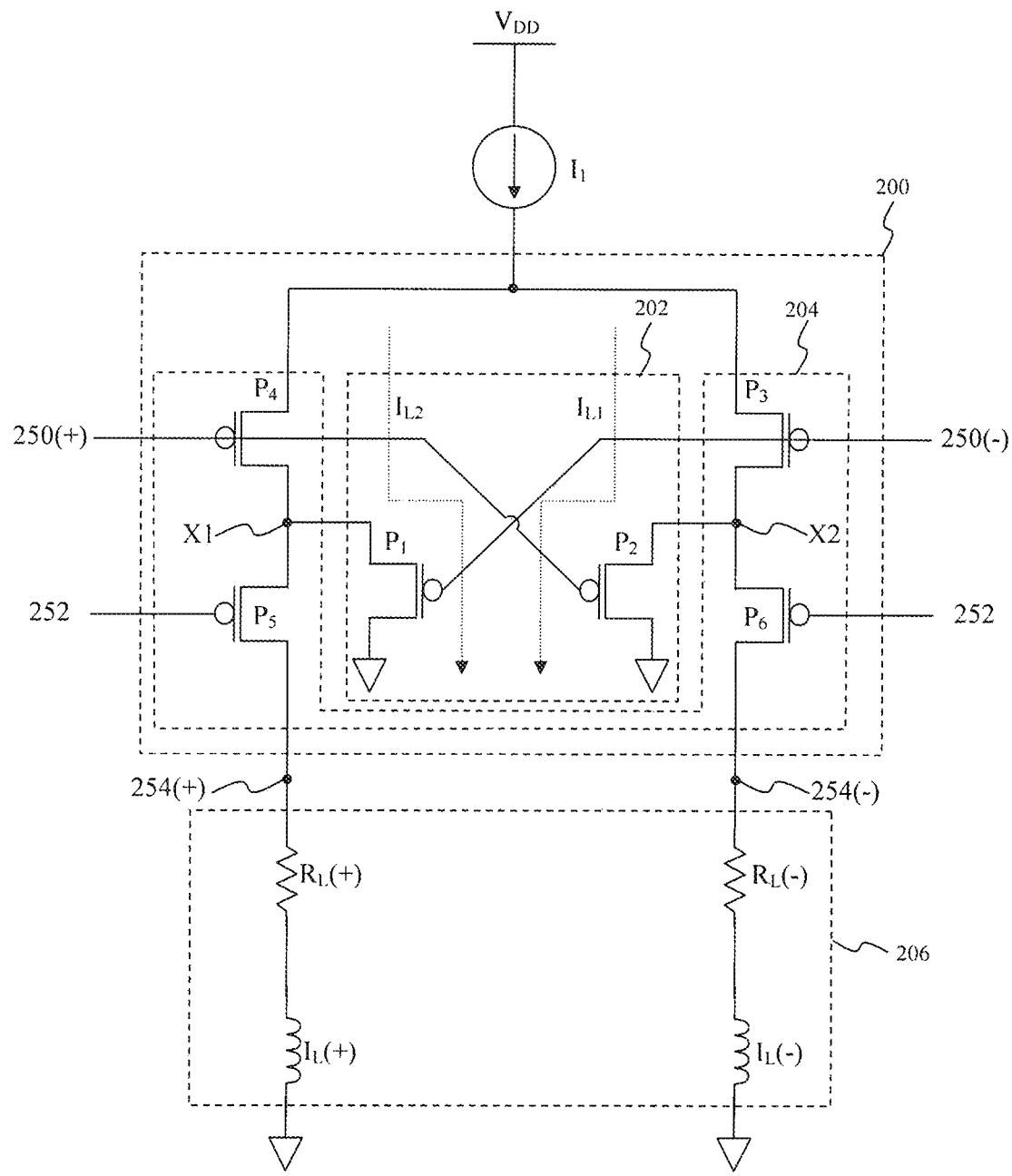
FIG. 2 illustrates a circuit diagram of a first exemplary line driver that can be implemented within the exemplary wireline transmission device according to an exemplary embodiment of the present disclosure.

Exemplary Line Drivers that can be Implemented within the Exemplary Wireline Transmission Device FIG. 2 illustrates a circuit diagram of a first exemplary line driver that can be implemented within the exemplary wireline transmission device according to an exemplary embodiment of the present disclosure. As illustrated in FIG. 2, a buffer amplifier 200 provides an impedance matching interface with a wireline communication channel, such as one or more twisted pair cables, one or more coaxial cables, and/or one or more fiber optic cables to provide some examples. In the exemplary embodiment illustrated in FIG. 2, the buffer amplifier 200 includes charging sharing circuitry 202 and buffering circuitry 204. The buffer amplifier 200 can represent an exemplary embodiment of the line driver 104 as described above in FIG. 1. As shown in FIG. 2, the buffer amplifier 200 can be characterized as being a circuit interface with the wireline communication channel. This wireline communication channel can be approximated as a wireline communication channel 206 as shown in FIG. 2. However, those skilled in the relevant art(s) will recognize the wireline communication channel can be approximated differently than shown in FIG. 2 without departing from the spirit and scope of the present disclosure.

In the exemplary embodiment illustrated in FIG. 2, the charging sharing circuitry 202 can be characterized as preventing charge sharing between a current source $I_1$ and the wireline communication channel 206. In this exemplary embodiment, the charging sharing circuitry 202 charges a first circuit node X1 and a second circuit node X2 to a first logical value, such as a logical zero. This charging of the first circuit node X1 and the second circuit node X2 prevents, or substantially lessens, charge sharing between the buffering circuitry 204 and the wireline communication channel 206. As illustrated in FIG. 2, the charging sharing circuitry 202 includes p-type metal-oxide-semiconductor field-effect (PMOS) transistors P1 and P2 and the buffering circuitry 204 includes PMOS transistors P3 through P6. In the exemplary embodiment illustrated in FIG. 2, the PMOS transistors P1 and P3 are implemented in a first gate coupled arrangement and the PMOS transistors P2 and P4 are implemented in a second gate coupled arrangement. In these gate coupled arrangements, a gate of the PMOS transistor P1 is coupled to a gate of the PMOS transistor P3 and a gate of the PMOS transistor P2 is coupled to a gate of the PMOS transistor P4.

During operation, the PMOS transistor P1 is conducting, namely, in an on-state, when a serial datastream 250(−) from among a serial datastream 250(+), 250(−) is at a first logical value, such as a logical zero. Herein, one or more embodiments described in this disclosure can refer to differential signals, denoted as <signal X(+), X(−)>, where the signal X(+) represents a complement of the signal X(−) as will be recognized by those skilled in the relevant art(s) without departing from the spirit and scope of the present disclosure. Referring to FIG. 2, the PMOS transistor P2 is conducting, namely, in an on-state, when a serial datastream 250(+) from among the serial datastream 250(+), 250(−) is at the first logical value. In an exemplary embodiment, the serial datastream 250(+), 250(−) can represent one or more of the one or more serial datastreams 154.1 through 154.n as described above in FIG. 1. The PMOS transistor P1 and the PMOS transistor P2, when in the on-state, cause the first circuit node X1 and the second circuit node X2, respectively, to be charged to the first logical value, such as a logical zero. This charging of the first circuit node X1 and the second circuit node X2 prevents the charging sharing between the current source $I_1$ and the wireline communication channel 206 when the PMOS transistor P3 and/or the PMOS transistor P4 of the buffering circuitry 204, which are to be discussed below, are non-conducting, namely, in an off-state. In other words, when the PMOS transistor P3 is in the off-state, a first leakage current $I_{L1}$ can flow from the current source $I_1$ through the PMOS transistor P3. This first leakage current $I_{L1}$ passes through the PMOS transistor P2, when in the on-state, to ground. Similarly, when the PMOS transistor P4 is in the off-state, a second leakage current $I_{L2}$ flows from the current source $I_1$ through the PMOS transistor P4. This second leakage current $I_{L2}$ passes through the PMOS transistor P1, when in the on-state, to ground. As such, the PMOS transistor P1 and the PMOS transistor P2, when in the on-state, prevent the second leakage current $I_{L2}$ and the first leakage current $I_{L1}$, respectively, from passing onto the wireline communication channel 206, namely, the charge sharing between the current source $I_1$ and the wireline communication channel 206.

As described above, the buffering circuitry 204 includes PMOS transistors P3 through P6. In the exemplary embodiment illustrated in FIG. 2, the PMOS transistor P3 and the PMOS transistor P6 are implemented in a serial arrangement with a drain of the PMOS transistor P3 being coupled to a source of the PMOS transistor P6. The PMOS transistor P4 and the PMOS transistor P5 are similarly implemented in the serial arrangement with a drain of the PMOS transistor P4 being coupled to a source of the PMOS transistor P5. As illustrated in FIG. 2, the buffering circuitry 204 passes the serial datastream 250(+), 250(−) onto the wireline communication channel 206 as an output datastream 254(+), 254(−) in response to a clocking signal 252. In an exemplary embodiment, the clocking signal 252 and the output datastream 254(+), 254(−) can represent exemplary embodiment of the clocking signal 156 and the output datastream 152, respectively, as described above in FIG. 1.

During operation, only one of the PMOS transistor P3 or the PMOS transistor P4 is conducting, namely, in an on-state, at any given instance in time. The PMOS transistor P3 and the PMOS transistor P6 are conducting, namely, in an on-state, when the serial datastream 250(−) and the clocking signal 252, respectively, are at a first logical value, such as a logical zero. In this situation, the current source $I_1$ flows through the PMOS transistor P3 and the PMOS transistor P6 to provide an output datastream 254(−) from among the output datastream 254(+), 254(−) at the second logical value, namely, logical one. And, from the discussion above, the first circuit node X1 is at the first logical value, namely, logical zero, when the PMOS transistor P1 is in the on-state to provide an output datastream 254(+) from among the output datastream 254(+), 254(−) at the first logical value, namely, logical zero. Likewise, the PMOS transistor P4 and the PMOS transistor P5 are conducting, namely, in an on-state, when the serial datastream 250(+) and the clocking signal 252, respectively, are at a first logical value, such as a logical zero. In this situation, the current source flows through the PMOS transistor P4 and the PMOS transistor P5 to provide the output datastream 254(+) from among the output datastream 254(+), 254(−) at the second logical value, namely, logical one. And, from the discussion above, the second circuit node X2 is at the first logical value, namely, logical zero, when the PMOS transistor P2 is in the on-state to provide the output datastream 254(−) from among the output datastream 254(+), 254(−) at the first logical value, namely, logical zero. Referring to FIG. 2, the PMOS transistor P5 and the PMOS transistor P6 are non-conducting, namely, in an off-state when the clocking signal 252 is at the second logical value, such as a logical one, to electrically isolate the buffer amplifier 200 from the wireline communication channel 206.

In the exemplary embodiment illustrated in FIG. 2, the wireline communication channel 206 represents an approximation of a wireline communication channel, such as one or more twisted pair cables, one or more coaxial cables, and/or one or more fiber optic cables to provide some examples. As illustrated in FIG. 2, the wireline communication channel 206 represents an approximation of a differential communication channel having resistive loads $R_L(+)$ and $R_L(−)$ and inductive loads $I_L(+)$ and $I_L(−)$. For example, the resistive load $R_L(+)$ and the inductive load $I_L(+)$ can represent a first cable from among a twisted pair cable and/or a termination circuit which provides an impedance to match a characteristic impedance of the wireline communication channel. In this example, the resistive load $R_L(−)$ and the inductive load $I_L(−)$ can represent a second cable from among the twisted pair cable and/or the termination circuit. This exemplary embodiment of the wireline communication channel 206 as illustrated in FIG. 2 is for exemplary purposes only. Those skilled in the relevant art(s) will recognize other approximations for other wireline communication channel are possible without departing from the spirit and scope of the present disclosure.

Figure 3:
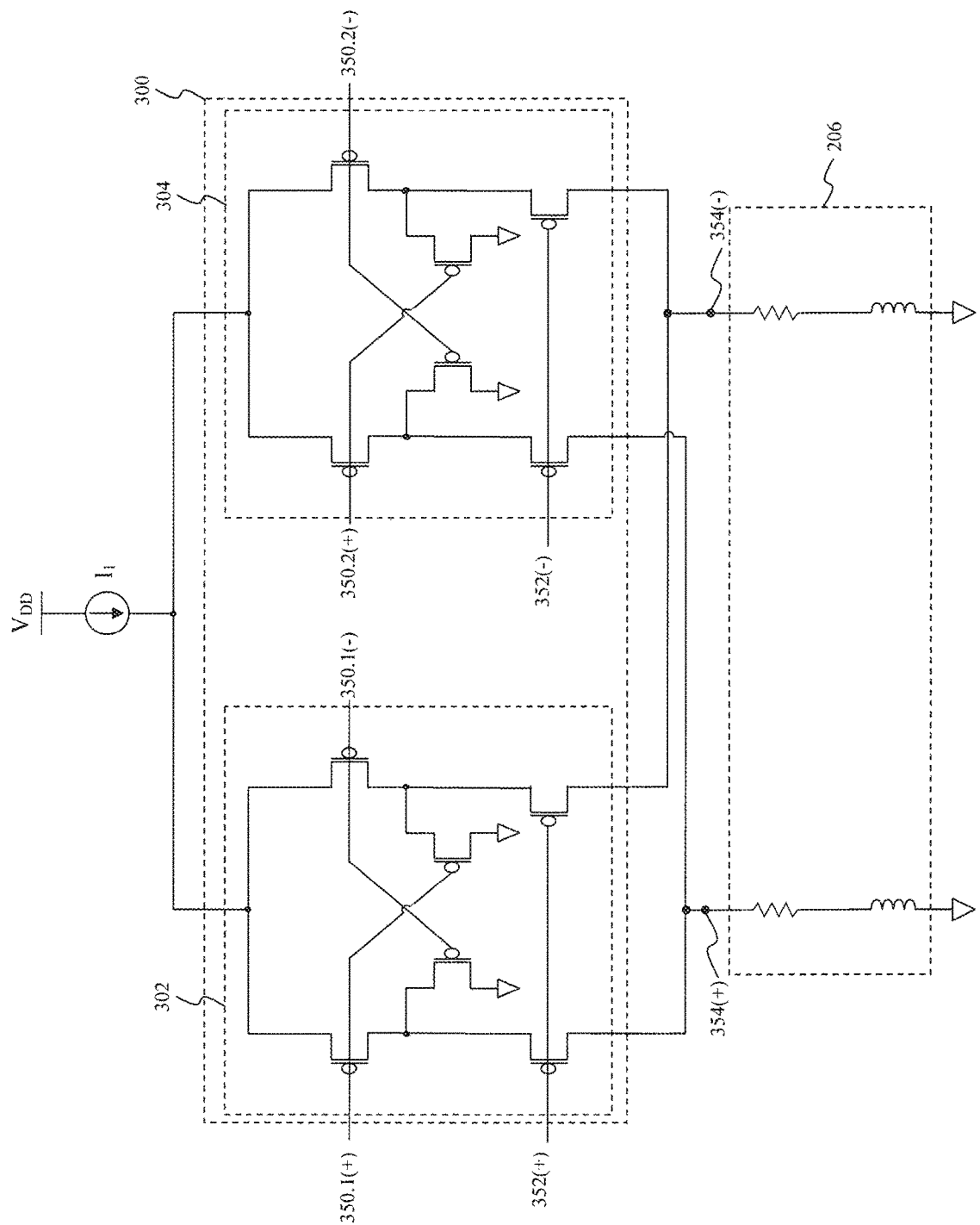
FIG. 3 illustrates a circuit diagram of a second exemplary line driver that can be implemented within the exemplary wireline transmission device according to an exemplary embodiment of the present disclosure.

FIG. 3 illustrates a circuit diagram of a second exemplary line driver that can be implemented within the exemplary wireline transmission device according to an exemplary embodiment of the present disclosure. As illustrated in FIG. 3, multiple buffer amplifiers, such as two or more of the buffer amplifier 200 to provide an example, can be independently controlled using one or more clocking signals to form a line driver 300. In an exemplary embodiment, the one or more clocking signals can represent a differential clocking signal to independently control the multiple buffer amplifiers as to be discussed in further detail below. In the exemplary embodiment illustrated in FIG. 3, the line driver 300 includes a buffer amplifier 302 and a buffer amplifier 304, each of which can represent an exemplary embodiment of the buffer amplifier 200 as described above in FIG. 2. The line driver 300 can represent an exemplary embodiment of the line driver 104 as described above in FIG. 1. As shown in FIG. 3, the line driver 300 can be characterized as being a circuit interface with the wireline communication channel. This wireline communication channel can be approximated using the wireline communication channel 206 as described above in FIG. 2.

In the exemplary embodiment illustrated in FIG. 3, the buffer amplifier 302 and the buffer amplifier 304 are implemented in a complementary arrangement. During operation, the buffer amplifier 302 selectively provides a first input datastream 350.1(+), 350.1(−) as an output datastream 354(+), 354(−) in response to a clocking signal 352(+) from among a clocking signal 352(+), 352(−) in a substantially similar manner as the buffer amplifier 200 as described above in FIG. 2. Likewise, the buffer amplifier 304 selectively provides a second input datastream 350.2(+), 350.2(−) as the output datastream 354(+), 354(−) in response to a clocking signal 352(−) from among the clocking signal 352(+), 352(−) in a substantially similar manner as the buffer amplifier 200 as described above in FIG. 2. In an exemplary embodiment, the first input datastream 350.1(+), 350.1(−) and the second input datastream 350.2(+), 350.2(−) can represent an exemplary embodiment of the two or more of the one or more serial datastreams 154.1 through 154.n as described above in FIG. 1. Similarly, in the exemplary embodiment illustrated in FIG. 3, the clocking signal 352(+), 352(−) can represent an exemplary embodiment of the clocking signal 156 as described above in FIG. 1.

This complementary arrangement for the clocking signal 352(+), 352(−) allows the line driver 300 to selectively choose from among the first input datastream 350.1(+), 350.1(−) and the second input datastream 350.2(+), 350.2(−) to provide the output datastream 354(+), 354(−). For example, when the clocking signal 352(+) is at the first logical value, such as a logical zero, the clocking signal 352(−) is at the second logical value, such as a logical one. In this example, the buffer amplifier 302 provides the first input datastream 350.1(+), 350.1(−) as the output datastream 354(+), 354(−) when the clocking signal 352(+) is at the first logical value and the clocking signal 352(−) electrically isolates the buffer amplifier 304 from the communication channel 206 when at the second logical value. As another example, when the clocking signal 352(−) is at the first logical value, such as a logical zero, the clocking signal 352(+) is at the second logical value, such as a logical one. In this example, the buffer amplifier 304 provides the second input datastream 350.2(+), 350.2(−) as the output datastream 354(+), 354(−) when the clocking signal 352(−) is at the first logical value and the clocking signal 352(+) electrically isolates the buffer amplifier 302 from the communication channel 206 when at the second logical value.

Figure 4:
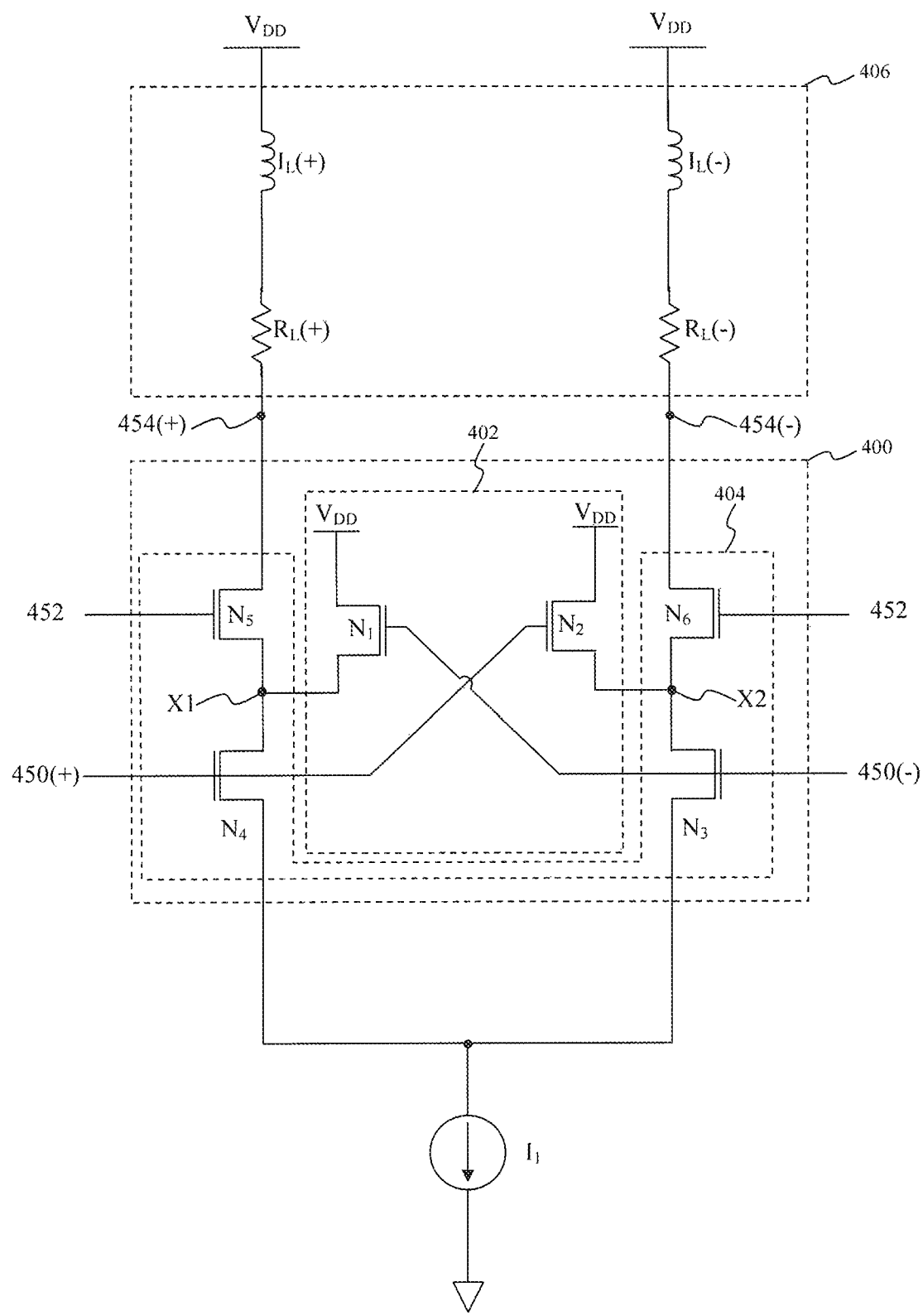
FIG. 4 illustrates a circuit diagram of a third exemplary line driver that can be implemented within the exemplary wireline transmission device according to an exemplary embodiment of the present disclosure.

FIG. 4 illustrates a circuit diagram of a third exemplary line driver that can be implemented within the exemplary wireline transmission device according to an exemplary embodiment of the present disclosure. As illustrated in FIG. 4, a buffer amplifier 400 provides an impedance matching interface with a wireline communication channel, such as one or more twisted pair cables, one or more coaxial cables, and/or one or more fiber optic cables to provide some examples. In the exemplary embodiment illustrated in FIG. 4, the buffer amplifier 400 includes charging sharing circuitry 402 and buffering circuitry 404. The buffer amplifier 400 can represent an exemplary embodiment of the line driver 104 as described above in FIG. 1. As shown in FIG. 4, the buffer amplifier 400 can be characterized as being a circuit interface with the wireline communication channel. This wireline communication channel can be approximated as a wireline communication channel 406 as shown in FIG. 4. However, those skilled in the relevant art(s) will recognize the wireline communication channel can be approximately differently than shown in FIG. 4 without departing from the spirit and scope of the present disclosure.

In the exemplary embodiment illustrated in FIG. 4, the charging sharing circuitry 402 can be characterized as preventing charge sharing between a current source $I_1$ and the wireline communication channel 406. In this exemplary embodiment, the charging sharing circuitry 402 charges a first circuit node X1 and a second circuit node X2 to a second logical value, such as a logical one. This charging of the first circuit node X1 and the second circuit node X2 prevents, or substantially lessens, charge sharing between the buffering circuitry 404 and the wireline communication channel 406. As illustrated in FIG. 4, the charging sharing circuitry 402 includes n-type metal-oxide-semiconductor field-effect (NMOS) transistors N1 and N2 and the buffering circuitry 404 includes NMOS transistors N3 through N6. In the exemplary embodiment illustrated in FIG. 4, the NMOS transistors N1 and N3 are implemented in a first gate coupled arrangement with a gate of the NMOS transistor N1 being coupled to a gate of the NMOS transistor N3 and the NMOS transistors N2 and N4 are implemented in a second gate coupled arrangement with a gate of the NMOS transistor N2 being coupled to a gate of the NMOS transistor N4.

During operation, the NMOS transistor N1 is conducting, namely, in an on-state, when a serial datastream 450(−) from among a serial datastream 450(+), 450(−) is at a second logical value, such as a logical one. The NMOS transistor N2 is conducting, namely, in an on-state, when a serial datastream 450(+) from among the serial datastream 450(+), 450(−) is at the second logical value. In an exemplary embodiment, the serial datastream 450(+), 450(−) can represent one or more of the one or more serial datastreams 154.1 through 154.n as described above in FIG. 1. The NMOS transistor N1 and the NMOS transistor N2, when in the on-state, cause the first circuit node X1 and the second circuit node X2, respectively, to be charged to the second logical value, such as a logical one. This charging of the first circuit node X1 and the second circuit node X2 prevents the charging sharing between the current source $I_1$ and the wireline communication channel 406 when the NMOS transistor N3 and/or the NMOS transistor N4 of the buffering circuitry 404, which are to be discussed below, are non-conducting, namely, in an off-state.

As described above, the buffering circuitry 404 includes NMOS transistors N3 through N6. In the exemplary embodiment illustrated in FIG. 4, the NMOS transistor N3 and the NMOS transistor N6 are implemented in a serial arrangement with a source of the NMOS transistor N3 being coupled to a drain of the NMOS transistor N6. The NMOS transistor N4 and the NMOS transistor N5 are similarly implemented in the serial arrangement with a source of the NMOS transistor N4 being coupled to a drain of the NMOS transistor N5. As illustrated in FIG. 4, the buffering circuitry 404 passes the serial datastream 450(+), 450(−) onto the wireline communication channel 406 as an output datastream 454(+), 454(−) in response to a clocking signal 452. In an exemplary embodiment, the clocking signal 452 and the output datastream 454(+), 454(−) can represent exemplary embodiment of the clocking signal 156 and the output datastream 152, respectively, as described above in FIG. 1.

During operation, only one of the NMOS transistor N3 and the NMOS transistor N4 is conducting, namely, in an on-state, at any given instance in time. The NMOS transistor N3 and the NMOS transistor N6 are conducting, namely, in an on-state, when the serial datastream 450(−) and the clocking signal 452, respectively, are at the second logical value, such as a logical one. In this situation, the current source $I_1$ sinks a current from the wireline communication channel 406 through the NMOS transistor N3 and the NMOS transistor N6 to provide an output datastream 454(−) from among the output datastream 454(+), 454(−) at the first logical value, namely, logical zero. And, from the discussion above, the first circuit node X1 is at the second logical value, namely, logical one, when the NMOS transistor N1 is in the on-state to provide an output datastream 454(+) from among the output datastream 454(+), 454(−) at the second logical value, namely, logical one. Likewise, the NMOS transistor N4 and the NMOS transistor N5 are conducting, namely, in an on-state, when the serial datastream 450(+) and the clocking signal 452, respectively, are at the second logical value, such as a logical one. In this situation, the current source $I_1$ sinks the current from the wireline communication channel 406 through the NMOS transistor N4 and the NMOS transistor N5 to provide the output datastream 454 (+) from among the output datastream 454(+), 454(−) at the first logical value, namely, logical zero. And, from the discussion above, the first circuit node X2 is at the second logical value, namely, logical one, when the NMOS transistor N2 is in the on-state to provide the output datastream 454(−) from among the output datastream 454(+), 454(−) at the second logical value, namely, logical one. Referring to FIG. 4, the NMOS transistor N5 and the NMOS transistor N6 are non-conducting, namely, in an off-state when the clocking signal 452 is at the first logical value, such as a logical zero, to electrically isolate the buffer amplifier 400 from the wireline communication channel 406.

In the exemplary embodiment illustrated in FIG. 4, the wireline communication channel 406 represents an approximation of a wireline communication channel, such as one or more twisted pair cables, one or more coaxial cables, and/or one or more fiber optic cables to provide some examples. As illustrated in FIG. 4, the wireline communication channel 406 represents an approximation of a differential communication channel having resistive loads $R_L(+)$ and $R_L(−)$ and inductive loads $I_L(+)$ and $I_L(−)$. For example, the resistive load $R_L(+)$ and the inductive load $I_L(+)$ can represent a first cable from among a twisted pair cable and/or a termination circuit which provides an impedance to match a characteristic impedance of the wireline communication channel. In this example, the resistive load $R_L(−)$ and the inductive load $I_L(−)$ can represent a second cable from among the twisted pair cable and/or the termination circuit. This exemplary embodiment of the wireline communication channel 406 as illustrated in FIG. 4 is for exemplary purposes only. Those skilled in the relevant art(s) will recognize other approximations for other wireline communication channel are possible without departing from the spirit and scope of the present disclosure.

Figure 5:
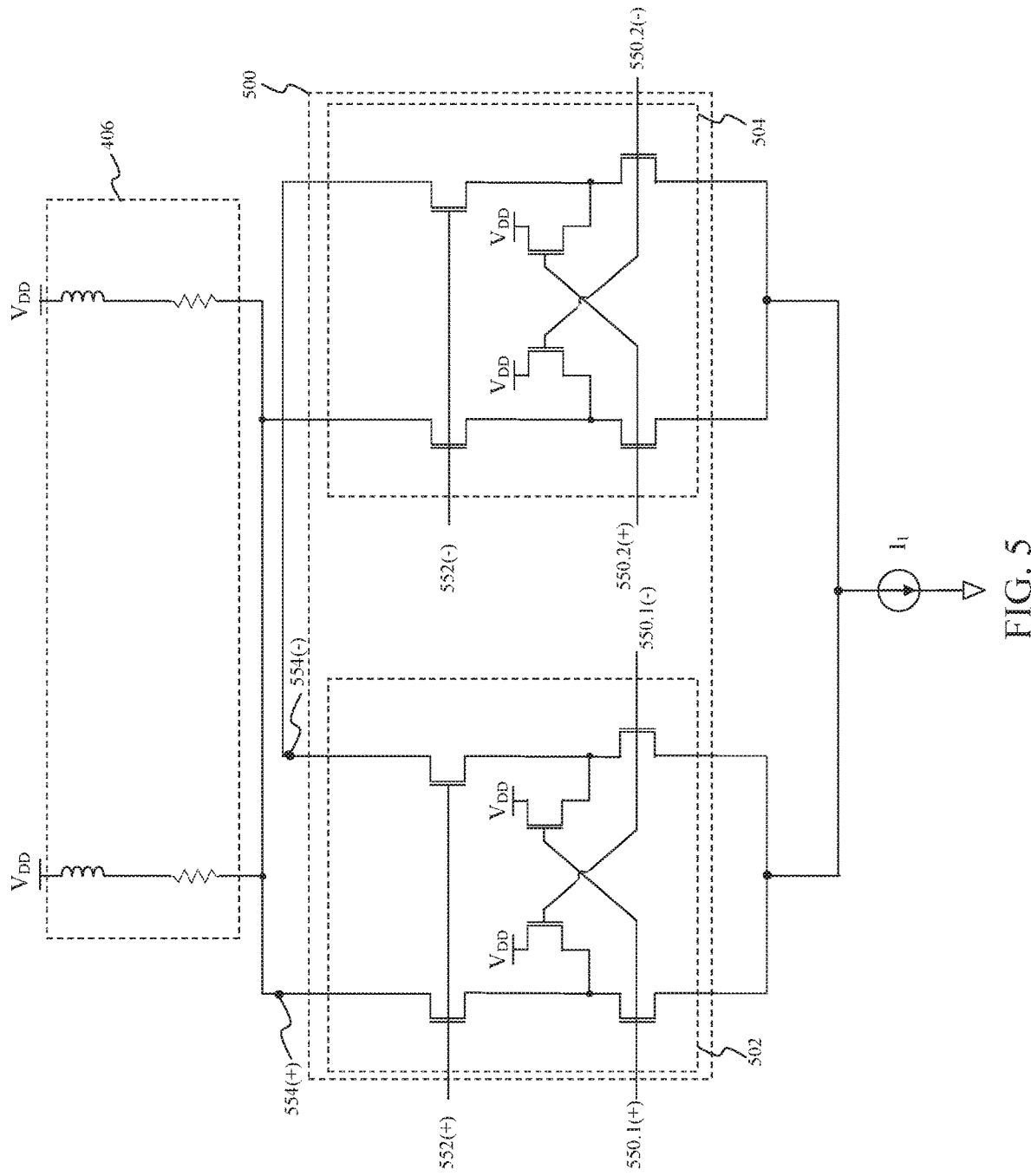
FIG. 5 illustrates a circuit diagram of a fourth exemplary line driver that can be implemented within the exemplary wireline transmission device according to an exemplary embodiment of the present disclosure.

FIG. 5 illustrates a circuit diagram of a fourth exemplary line driver that can be implemented within the exemplary wireline transmission device according to an exemplary embodiment of the present disclosure. As illustrated in FIG. 5, multiple buffer amplifiers, such as two or more of the buffer amplifier 400 to provide an example, can be independently controlled using one or more clocking signals to form a line driver 500. In an exemplary embodiment, the one or more clocking signals can represent a differential clocking signal to independently control the multiple buffer amplifiers as to be discussed in further detail below. In the exemplary embodiment illustrated in FIG. 5, the line driver 500 includes a buffer amplifier 502 and a buffer amplifier 504, each of which can represent an exemplary embodiment of the buffer amplifier 400 as described above in FIG. 4. The line driver 500 can represent an exemplary embodiment of the line driver 104 as described above in FIG. 1. As shown in FIG. 5, the line driver 500 can be characterized as being a circuit interface with the wireline communication channel. This wireline communication channel can be approximated using the wireline communication channel 406 as described above in FIG. 4.

In the exemplary embodiment illustrated in FIG. 5, the buffer amplifier 502 and the buffer amplifier 504 are implemented in a complementary arrangement. During operation, the buffer amplifier 502 selectively provides a first input datastream 550.1(+), 550.1(−) as an output datastream 554 (+), 554(−) in response to a clocking signal 552(+) from among a clocking signal 552(+), 552(−) in a substantially similar manner as the buffer amplifier 400 as described above in FIG. 4. Likewise, the buffer amplifier 504 selectively provides a second input datastream 550.2(+), 550.2(−)

as the output datastream 554(+), 554(−) in response to a clocking signal 552(−) from among the clocking signal 552(+), 552(−) in a substantially similar manner as the buffer amplifier 400 as described above in FIG. 4. In an exemplary embodiment, the first input datastream 550.1(+), 550.1(−) and the second input datastream 550.2(+), 550.2(−) can represent an exemplary embodiment of the two or more of the one or more serial datastreams 154.1 through 154.n as described above in FIG. 1. Similarly, in the exemplary embodiment illustrated in FIG. 5, the clocking signal 552(+), 552(−) can represent an exemplary embodiment of the clocking signal 156 as described above in FIG. 1.

This complementary arrangement for the clocking signal 552(+), 552(−) allows the line driver 500 to selectively choose from among the first input datastream 550.1(+), 550.1(−) and the second input datastream 550.2(+), 550.2(−) to provide the output datastream 554(+), 554(−). For example, when the clocking signal 552(+) is at the second logical value, such as a logical one, the clocking signal 552(−) is at the first logical value, such as a logical zero. In this example, the buffer amplifier 502 provides the first input datastream 550.1(+), 550.1(−) as the output datastream 554(+), 554(−) when the clocking signal 552(+) is at the second logical value and the clocking signal 552(−) electrically isolates the buffer amplifier 504 from the communication channel 406 when at the first logical value. As another example, when the clocking signal 552(−) is at the second logical value, such as a logical one, the clocking signal 552(+) is at the first logical value, such as a logical zero. In this example, the buffer amplifier 504 provides the second input datastream 550.2(+), 550.2(−) as the output datastream 554(+), 554(−) when the clocking signal 552(−) is at the second logical value and the clocking signal 552(+) electrically isolates the buffer amplifier 502 from the communication channel 406 when at the first logical value.

Exemplary Operational Control Flow for the Exemplary Line Drivers

Figure 6:
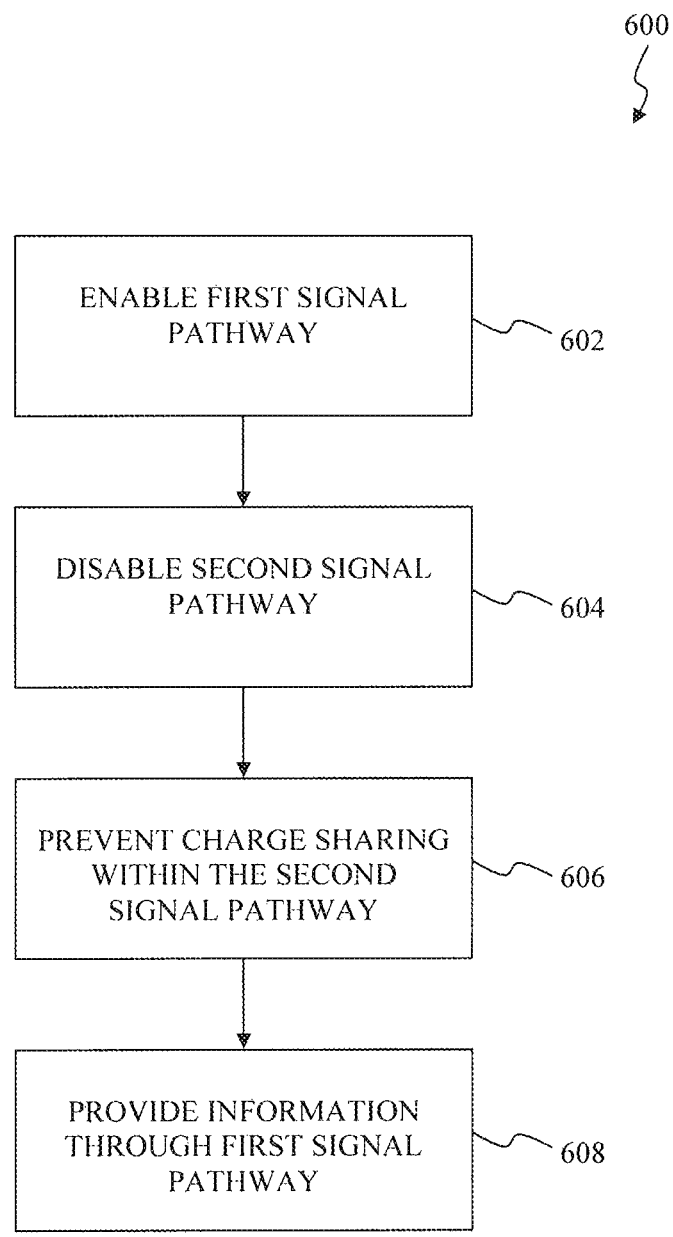
FIG. 6 illustrates a flowchart of exemplary operations for the exemplary line driver according to an exemplary embodiment of the present disclosure.

FIG. 6 illustrates a flowchart of exemplary operations for the exemplary line driver according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 600 for an exemplary line driver, such as the line driver 104, the buffer amplifier 200, the line driver 300, the buffer amplifier 400, and/or the line driver 500 to provide some examples.

At operation 602, the operational control flow 600 enables a first signal pathway from among multiple signal pathways of the exemplary line driver. For example, and referring to FIG. 2, the exemplary line driver includes the first signal pathway including the PMOS transistor P4 and the PMOS transistor P5 and a second signal pathway including the PMOS transistor P3 and the PMOS transistor P6. In this example, the operational control flow 600 enables the first signal pathway by providing a first logical value, such as a logical zero, to the PMOS transistor P4 and the PMOS transistor P5. As another example, and referring to FIG. 4, the exemplary line driver includes the first signal pathway including the NMOS transistor N4 and the NMOS transistor N5 and a second signal pathway including the NMOS transistor N3 and the NMOS transistor N6. In this other example, the operational control flow 600 enables the first signal pathway by providing a second logical value, such as a logical one, to the NMOS transistor N4 and the NMOS transistor N5.

At operation 604, the operational control flow 600 disables a second signal pathway from among multiple signal pathways of the exemplary line driver. For example, and referring to FIG. 2, the operational control flow 600 disables the second signal pathway by providing the second logical value, such as a logical one, to the PMOS transistor P3 and the PMOS transistor P6. As another example, and referring to FIG. 4, the exemplary line driver disables the second signal pathway by providing the first logical value, such as a logical zero, to the NMOS transistor N3 and the NMOS transistor N6.

At operation 606, the operational control flow 600 prevents charging sharing within the second signal pathway from operation 604. The operational control flow 600 charges a circuit node of the second signal pathway from operation 604 to the first logical value, such as a logical zero, to prevent charge sharing within the second signal pathway from operation 604. For example, the operational control flow 600 charges a circuit node, such as the second circuit node X2 as illustrated in FIG. 2 and FIG. 4 to the first logical value. As illustrated in FIG. 2 and FIG. 4, this prevents charge from being shared between the exemplary line driver and the wireline communication channel 206 as described above in FIG. 2 or the wireline communication channel 406 as described above in FIG. 4.

At operation 608, the operational control flow 600 provides information through the first signal pathway from operation 602.

CONCLUSION

The foregoing Detailed Description discloses a buffer amplifier including buffering circuitry having a first group of transistors and charging sharing circuitry having a second group of transistors. A first transistor and a second transistor from among the first group of transistors are implemented in a first serial arrangement. A third transistor and a fourth transistor from among the first group of transistors are implemented in a second serial arrangement. A fifth transistor from among the second group of transistors and the third transistor are implemented in a first gate coupled arrangement. A sixth transistor from among the second group of transistors and the fourth transistor are implemented in a second gate coupled arrangement.

The foregoing Detailed Description additionally discloses a buffer amplifier including buffering circuitry having a first signal pathway and a second signal pathway and charging sharing circuitry. The first signal pathway and the second signal pathway include a first circuit node and a second circuit node, respectively. The charging sharing circuitry charges the first circuit node to a logical value when the first signal pathway is disabled and to charge the second circuit node to the logical value when the second signal pathway is disabled.

The foregoing Detailed Description further discloses a line driver including a first buffer amplifier having a first signal pathway and a second signal pathway and a second buffer amplifier. The first buffer amplifier selectively provides a first input datastream utilizing the first signal pathway or the second signal pathway in response to a first clocking signal from among a differential clocking signal being at a first logical level. The second signal pathway is at a second logical level when the first signal pathway is being utilized to provide the first input datastream. The first signal pathway is at the second logical level when the second signal pathway is being utilized to provide the first input datastream. The second buffer amplifier is selectively provides a second input datastream in response to a second clocking signal from among the differential clocking signal being at the first logical level.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A buffer amplifier, comprising:
   buffering circuitry including a first plurality of transistors; and
   charging sharing circuitry including a second plurality of transistors,
   wherein a first transistor and a second transistor from among the first plurality of transistors are implemented in a first serial arrangement,
   wherein a third transistor and a fourth transistor from among the first plurality of transistors are implemented in a second serial arrangement,
   wherein a fifth transistor from among the second plurality of transistors and the third transistor are implemented in a gate coupled arrangement, and
   wherein respective gates of the first transistor and the third transistor define a differential input of the buffer amplifier configured to receive a differential input data stream that controls the gate coupled arrangement.

2. The buffer amplifier of claim 1, wherein a first connection of the first transistor, a first connection of the second transistor, and a first connection of the fifth transistor are configured to form a first circuit node, and
   wherein the charging sharing circuitry is configured to charge the first circuit node to a logical zero when the third transistor is in an on-state.

3. The buffer amplifier of claim 2, wherein a first connection of the third transistor, a first connection of the fourth transistor, and a first connection of a sixth transistor are configured to form a second circuit node; and
   wherein the charging sharing circuitry is configured to charge the second circuit node to the logical zero when the first transistor is in the on-state.

4. The buffer amplifier of claim 1, wherein the first plurality of transistors and the second plurality of transistors comprise:
   a plurality of p-type metal-oxide-semiconductor field-effect (PMOS) transistors.

5. The buffer amplifier of claim 1, wherein the first plurality of transistors and the second plurality of transistors comprise:
   a plurality of n-type metal-oxide-semiconductor field-effect (NMOS) transistors.

6. The buffer amplifier of claim 1, further comprising:
   a current source configured to provide a current,
   wherein the charging sharing circuitry is configured to charge a first circuit node between the first transistor and the second transistor to a logical zero when the third transistor is in an on-state.

7. The buffer amplifier of claim 6, wherein the charging sharing circuitry is configured to charge a second circuit node between the third transistor and the fourth transistor to a logical zero when the first transistor is in the on-state.

8. A buffer amplifier, comprising:
   a current source configured to provide a current;
   buffering circuitry having a first signal pathway and a second signal pathway, the first signal pathway and the second signal pathway including a first circuit node and a second circuit node, respectively; and charging sharing circuitry configured to:
 charge the first circuit node to a logical zero to prevent the current from flowing through an output of the first signal pathway when the first signal pathway is disabled, and
 charge the second circuit node to the logical zero to prevent the current from flowing through an output of the second signal pathway when the second signal pathway is disabled.

9. The buffer amplifier of claim 8, wherein the buffering circuitry comprises a plurality of transistors,
 wherein the first signal pathway comprises:
  a first transistor and a second transistor, the first transistor and the second transistor being implemented in a first serial arrangement, and
 wherein the second signal pathway comprises:
  a third transistor and a fourth transistor, the third transistor and the fourth transistor being implemented in a second serial arrangement.

10. The buffer amplifier of claim 9, wherein the charging sharing circuitry comprises a fifth transistor and a sixth transistor,
 wherein a first connection of the first transistor, a first connection of the second transistor, and a first connection of the fifth transistor are configured to form the first circuit node, and
 wherein the charging sharing circuitry is configured to charge the first circuit node to the logical zero when the third transistor is in an on-state.

11. The buffer amplifier of claim 10, wherein a first connection of the third transistor, a first connection of the fourth transistor, and a first connection of the sixth transistor are configured to form the second circuit node, and
 wherein the charging sharing circuitry is configured to charge the second circuit node to the logical zero when the first transistor is in the on-state.

12. The buffer amplifier of claim 10, wherein the first transistor, the second transistor, the third transistor, the fourth transistor, the fifth transistor, and the sixth transistor comprise:
 a plurality of p-type metal-oxide-semiconductor field-effect (PMOS) transistors.

13. The buffer amplifier of claim 10, wherein the first transistor, the second transistor, the third transistor, the fourth transistor, the fifth transistor, and the sixth transistor comprise:
 a plurality of n-type metal-oxide-semiconductor field-effect (NMOS) transistors.

14. The buffer amplifier of claim 10, wherein the first signal pathway is disabled in response to a first clocking signal from among a differential clocking signal being at a logical one, and wherein the second signal pathway is disabled in response to a second clocking signal from among the differential clocking signal being at a logical one.

15. A line driver, comprising:
 a first buffer amplifier having a first signal pathway and a second signal pathway; and
 a second buffer amplifier;
 wherein the first buffer amplifier is configured to selectively provide a first input datastream utilizing the first signal pathway or the second signal pathway in response to a first clocking signal from among a differential clocking signal being at a first logical level, and
 wherein the first signal pathway is charged to the first logical level when the second signal pathway is being utilized to provide the first input datastream.

16. The line driver of claim 15, wherein the second signal pathway is charged to the first logical level when the first signal pathway is being utilized to provide the first input datastream.

17. The line driver of claim 15, wherein the first buffer amplifier comprises:
 buffering circuitry having the first signal pathway and the second signal pathway, the first signal pathway and the second signal pathway including a first circuit node and a second circuit node, respectively; and
 charging sharing circuitry configured to charge the first circuit node to the first logical level when the second signal pathway is being utilized to provide the first input datastream.

18. The line driver of claim 17, wherein the buffering circuitry comprises a plurality of transistors,
 wherein the first signal pathway comprises:
  a first transistor and a second transistor, the first transistor and the second transistor being implemented in a first serial arrangement, and
 wherein the second signal pathway comprises:
  a third transistor and a fourth transistor, the third transistor and the fourth transistor being implemented in a second serial arrangement.

19. The line driver of claim 17, further comprising:
 a current source configured to provide a current, and
 wherein the charging sharing circuitry is configured to charge the first circuit node to the first logical level to prevent the current from flowing through an output of the first signal pathway when the second signal pathway is being utilized to provide the first input datastream.

20. The line driver of claim 19, wherein the charge sharing circuitry is configured to charge the second circuit node to the first logical level to prevent the current from flowing through an output of the second signal pathway when the first signal pathway is being utilized to provide the first input datastream.

* * * * *